United States Patent [19]

McTaggart

[11] 4,068,176
[45] Jan. 10, 1978

[54] DIRECT READING SINAD METER

[75] Inventor: James Everett McTaggart, Malibu, Calif.

[73] Assignee: The Singer Company, New York, N.Y.

[21] Appl. No.: 715,028

[22] Filed: Aug. 17, 1976

[51] Int. Cl.² .............................................. G01R 27/00
[52] U.S. Cl. ..................... 325/363; 325/398; 325/473; 325/67
[58] Field of Search ................ 325/363, 67, 398, 404, 325/405, 408, 411, 474, 476, 473, 477; 328/162

[56] References Cited

U.S. PATENT DOCUMENTS

| | | | |
|---|---|---|---|
| 2,589,662 | 3/1952 | Bjornson | 325/474 |
| 2,959,672 | 11/1960 | Haise | 325/363 |
| 3,122,704 | 2/1964 | Jones | 325/363 |
| 3,387,222 | 6/1968 | Hellwarth et al. | 325/474 |
| 3,506,915 | 4/1970 | Harris et al. | 325/363 |
| 3,631,344 | 12/1971 | Greenwald | 325/408 |
| 3,835,378 | 9/1974 | Edden et al. | 325/363 |

Primary Examiner—Robert L. Griffin
Assistant Examiner—Tommy P. Chin
Attorney, Agent, or Firm—Charles R. Lewis

[57] ABSTRACT

The disclosed circuitry accepts from a radio receiver under test audio signals consisting of the signal plus noise and distortion (S + N + D), levels, and subtracts from it a separately generated signal (− S) corresponding in frequency and amplitude to the audio signal without noise and distortion. The resulting absolute value of noise plus distortion (N + D) is applied to a meter which may be calibrated to indicate the SINAD ratio.

10 Claims, 1 Drawing Figure

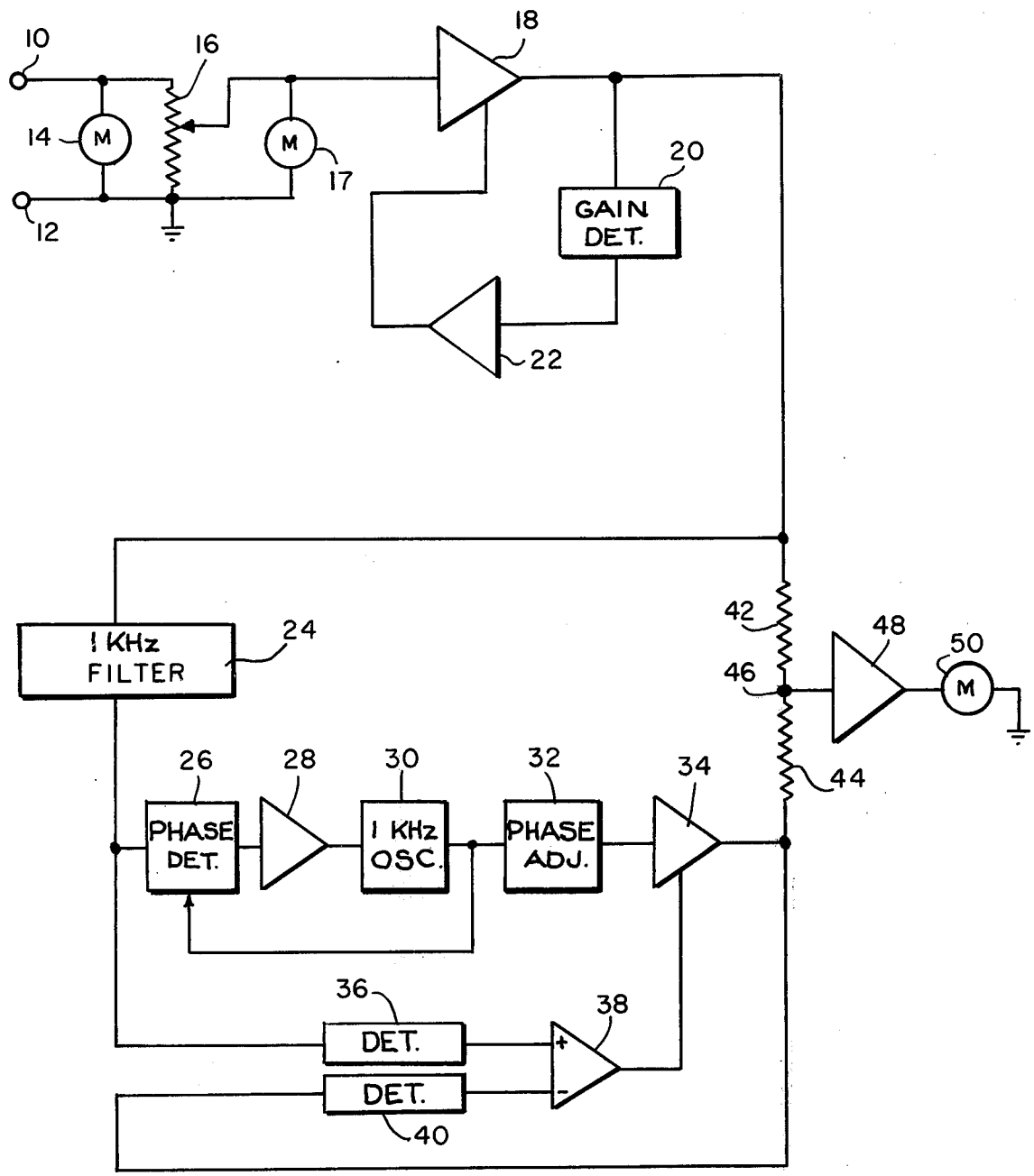

DIRECT READING SINAD METER

BACKGROUND OF THE INVENTION

SINAD, an acronym for "signal + noise + distortion to noise + distortion ratio", is the measure of audio output signal quality for a given receiver audio power output level. Instruments indicating SINAD are used extensively, for example, in evaluating radio receiver selectivity by measuring the signal attenuation at various frequencies offset from the tuned frequency. Selectivity measurements using a SINAD method has been adopted as the standard method procedure described in IEEE Standard 184-1969, Test Procedure for Frequency-Modulated Mobile Communication Receivers, in use in the United States and throughout the world.

DESCRIPTION OF PRIOR ART

The accepted method of measuring receiver signal quality is to apply a carrier frequency modulated with a 1,000 Hz audio signal to the input port of the receiver to be tested. The audio output signal from the receiver is then applied through a 1,000 Hz notch filter to an audio output meter. The notch filter is bypassed by a switch so that, in making the tests, the filter is bypassed so that the output meter will read signal + noise + distortion. Then the bypass switch is opened, the 1,000 Hz signal is eliminated, and the output meter reads residual noise + distortion. The SINAD value is the ratio of the measurement with the signal (S + N + D) to the measurement without the signal (N + D).

Each SINAD measurement is a sub-routine in itself, tending to be indirect and tedious as performed using a conventional distortion meter. Even if the distortion meter is equipped to automatically balance the fundamental rejection notch filter, it is still necessary to switch back and forth between the audio reference level (S + N + D), and the noise and distortion (N + D), reading several times while varying the signal level in order to attain the desired SINAD reading precisely. U.S. Pat. No. 2,959,672 to La Haise describes a system in which such a switching is accomplished by use of a multivibrator controlled electronic switch operating at a frequency of 10 Hz. While the circuitry described in this patent provides a greatly improved method of reading SINAD, its operation is slow and awkward compared to the present invention for a direct reading SINAD meter which accommodates changes in the audio reference level (S + N + D) automatically.

SUMMARY OF THE INVENTION

Briefly described, the present invention provides a means for directly obtaining the SINAD value without the necessity of switching through a rejection filter. The signal (S + N + D) received from the output of the receiver is leveled by a gain control amplifier circuit, the output of which is sampled by a circuit comprising a 1,000 Hz filter which passes the signal (S) to a phase locked loop that generates an output signal corresponding to the signal (S) from the receiver under test. The output of the phase locked loop is applied to a gain control amplifier which inverts the generated signal (−S) and adjusts its level to correspond to the value of the signal (S) in the combination signal (S + N + D) at the output of the signal leveling amplifier. The output of the signal leveling amplifier (S + N + D) is added to the output of the phase locked loop circuit (− S), resulting in a cancellation of the signal (S) so that a meter at the output of the addition circuitry reads the value of noise and distortion (N + D). Since the value of S + N + D is held constant by the leveling amplifier, the output meter may be calibrated to directly indicate SINAD in dB.

BRIEF DESCRIPTION OF THE DRAWING

In the drawing which illustrates a preferred embodiment of the invention:

The single FIGURE is a block diagram illustrating the direct readiang SINAD meter of the invention.

DESCRIPTION OF PREFERRED EMBODIMENT

Turning now to a detailed description of the invention, a 1,000 Hz audio test signal including noise and distortion (S + N + D) is applied from a receiver under test to input terminals 10 and 12 where the power level may be monitored by a meter 14 connected across a selected audio dummy load resistance 16. Resistance 16 may be a potentiometer adjustable to produce a signal of appropriate level to a gain control amplifier 18. A meter 17 indicates the level of the signal (S + N + D) applied to the gain control amplifier 18. The output of the gain control amplifier 18 is detected by a level detector 20, amplified to a suitable level by amplifier 22 and reapplied to the gain control amplifier to produce an output signal (S + N + D) of constant r.m.s. level regardless of variations to the input signal (S + N + D).

The leveled (S + N + D) signal from the gain control amplifier 18 is applied to a 1,000 Hz filter 24, which filters out most of the noise and distortion and passes the 1,000 Hz signal (S). The output of the filter 24 is applied to a phase locked loop comprising a phase detector 26, an amplifier 28 and a voltage controlled oscillator 30, the output of which is fed back to the phase detector 26 so that the output of the oscillator 30 corresponds precisely in frequency and phase to the 1,000 Hz signal passed by the filter 24. The output of oscillator 30 is applied to a phase adjusting circuit 32 which permits static phase vernier adjustments to the signal and thence to a gain control amplifier 34 which inverts the 1,000 Hz signal (S) and provides an output (−S) which is automatically controlled to equal the level of the 1,000 Hz signal from the filter 24. It is necessary to control the amplitude of the inverted output −S inasmuch as there is no assurance that it will be equal in amplitude, even though 180° out of phase with, the signal S passed by the filter 24. This is accomplished by comparing the level of the signal (S) from filter 24 as detected by a level detector 36, with the level of the 1,000 Hz oscillator signal at the output of the gain control amplifier 34 as detected by a level detector 40, by means of a comparator 38 whose output controls the gain of amplifier 34.

The output of amplifier 34 (−S) and the output of the gain control amplifier 18 (S + N + D) is applied to a summation circuit comprising identical resistances 42 and 44 to produce, at the center junction 46 a signal representing only noise and distortion (N + D). This is applied through an appropriate amplifier 48 to a meter 50 which indicates the value of (N + D). Since the leveled output of the gain control amplifier 18 is held constant regardless of the variations in its input, output meter 50 may be calibrated directly to represent SINAD and, if desired, may be made logarithmic in amplitude response to indicate directly in dB on a linear scale.

What is claimed is:

1. A noise and distortion meter comprising:
   input circuitry adapted for coupling to the output terminal of a radio receiver under test for receiving an output signal including noise and distortion from said receiver;
   circuit means coupled to said input circuit for leveling the output of said receiver under test to a constant level;
   signal generating means coupled to the output of said circuit means for generating a signal corresponding in frequency, phase, and amplitude to the signal portion of said receiver output; and
   means coupled to said circuit means and to said signal generating means for subtracting said generated signal from said receiver output to produce an output signal comprising said receiver noise and distortion.

2. The meter claimed in claim 1 wherein said signal generating means includes:
   a filter coupled to the output of said circuit means for transmitting the signal portion and rejecting substantially all of the noise and distortion portions of said receiver output;
   a phase locked loop coupled to said filter and controlled by the signal transmitted thereby;
   a gain controlled amplifier coupled to said phase locked loop, said amplifier being controlled by the signal transmitted by said filter and by the signal output of said amplifier for adjusting said signal output to a level corresponding to said signal portion of said receiver output.

3. The meter claimed in claim 1 wherein said signal generating means produces an ouput signal that is inverted in phase from said signal portion of said receiver output, and wherein said means for subtracting said generated signal from said receiver output includes a resistor summing circuit coupled to the outputs of said circuit means and said gain controlled amplifier.

4. The meter of claim 1 wherein said circuit means includes a gain control amplifier.

5. The meter of claim 1 further including an output meter coupled to said means for substracting to indicate the level of said output signal.

6. The meter claimed in claim 5 wherein said output meter is calibrated in SINAD values.

7. The meter of claim 1 wherein said circuit means includes a gain control amplifier.

8. The meter of claim 1 wherein said input circuitry includes means for adjusting the level of said receiver output.

9. The meter of claim 2 further including phase adjusting means coupled between said phase locked loop and said gain control amplifier.

10. The meter according to claim 1 wherein said constant level output of said circuit means in a constant r.m.s. level.

* * * * *